United States Patent [19]

Manning

[11] Patent Number: 5,177,028
[45] Date of Patent: Jan. 5, 1993

[54] TRENCH ISOLATION METHOD HAVING A DOUBLE POLYSILICON GATE FORMED ON MESAS

[75] Inventor: Monte Manning, Boise, Id.

[73] Assignee: Micron Technology, Inc., Boise, Id.

[21] Appl. No.: 782,002

[22] Filed: Oct. 22, 1991

[51] Int. Cl.⁵ ............................................. H01L 21/76
[52] U.S. Cl. ..................................... 437/41; 437/67; 148/DIG. 50
[58] Field of Search ...................... 437/41, 43, 45, 46, 437/67, 160, 162, 191; 148/DIG. 50

[56] References Cited

U.S. PATENT DOCUMENTS

| | | | |
|---|---|---|---|
| 4,536,950 | 9/1985 | Sadamatsu et al. | 437/160 |
| 4,791,073 | 12/1988 | Nagy et al. | 437/67 |
| 4,892,614 | 1/1990 | Chapman et al. | 437/67 |
| 4,927,777 | 5/1990 | Hsu et al. | 437/41 |
| 5,106,772 | 4/1992 | Lai | 437/43 |

Primary Examiner—Brian E. Hearn
Assistant Examiner—C. Chaudhari
Attorney, Agent, or Firm—Wells, St. John, Roberts Gregory & Matkin

[57] ABSTRACT

A method of forming isolation trenches and mesa areas in a semiconductor substrate and of forming FETs in the mesa areas is disclosed. The method includes providing a first oxide layer, a first undoped polysilicon layer, and an etch stop layer on a silicon substrate. Isolation trenches and mesa areas are then defined by etching the substrate. A second oxide layer is provided to fill the isolation trenches, and is subsequently etched to remove second layer oxide above the mesa areas, thus exposing the first polysilicon layer. The method further comprises providing a second, conductively doped polysilicon layer over the exposed first polysilicon layer, wherein the first polysilicon layer is autodoped by the second polysilicon layer in a subsequent step. The first and second layers of polysilicon are patterned and etched to define FET gates in the mesa areas, with the first oxide layer beneath the first polysilicon layer being utilized as gate oxide.

20 Claims, 6 Drawing Sheets

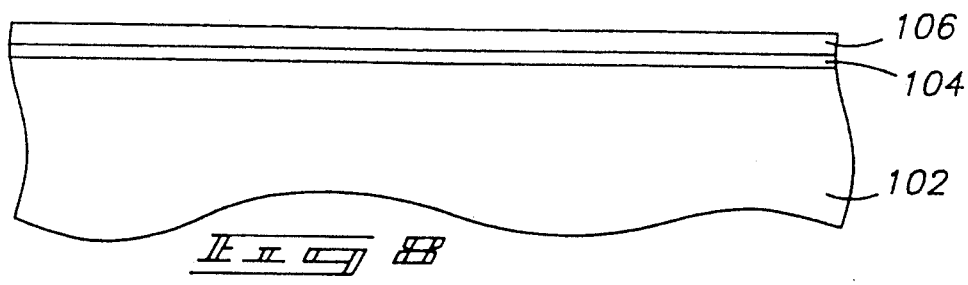
_Fig. 8_
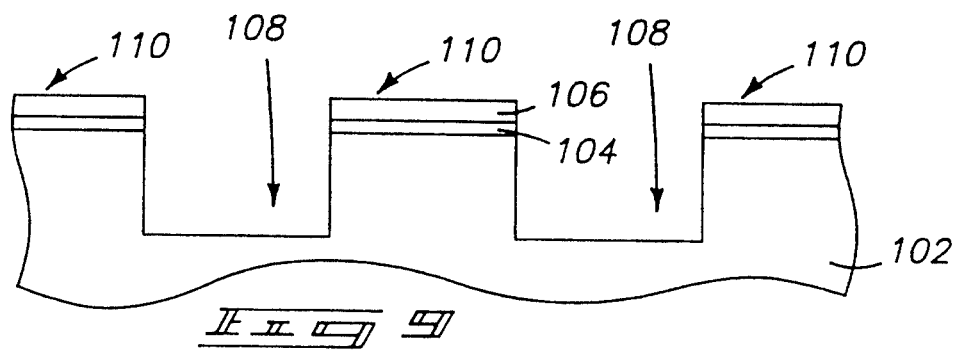
_Fig. 9_
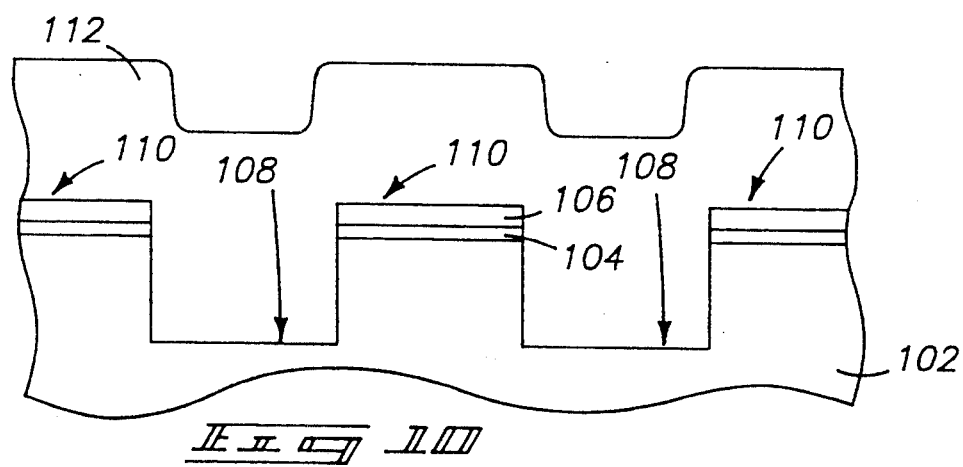
_Fig. 10_
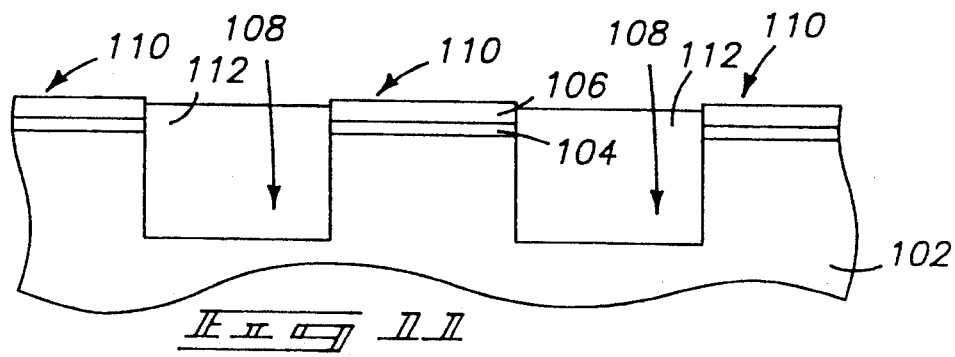
_Fig. 11_

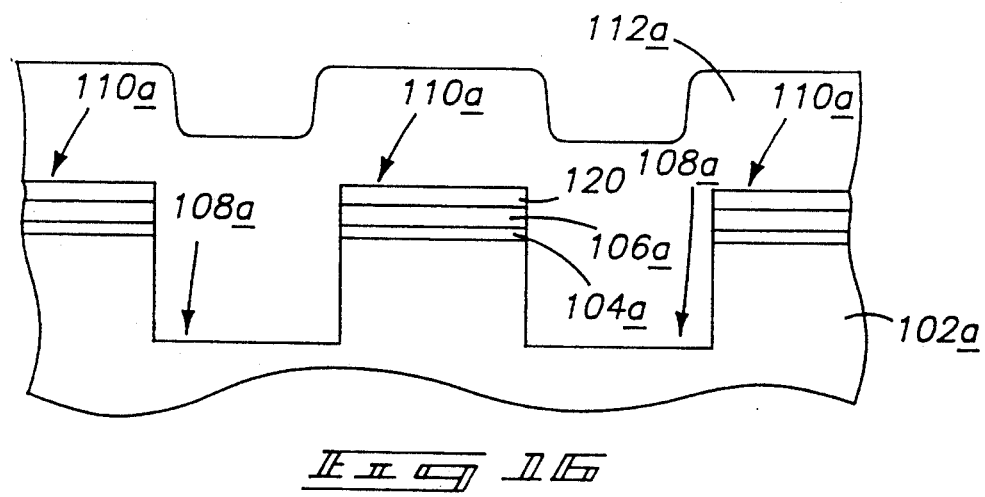
_FIG. 16_
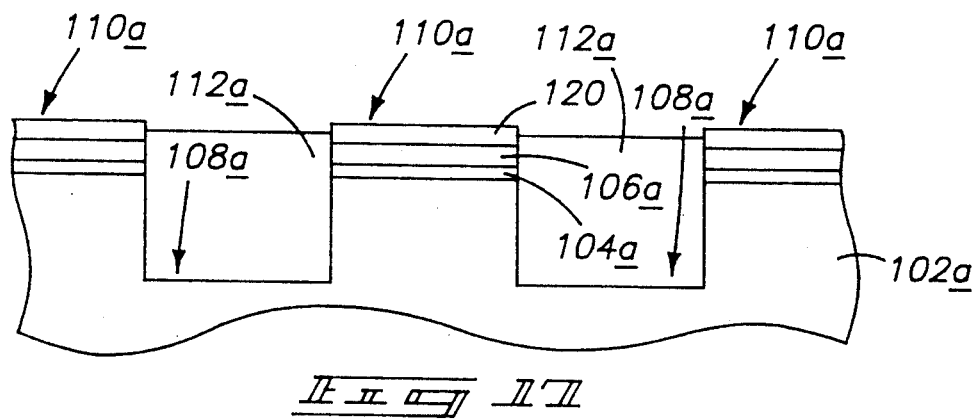
_FIG. 17_
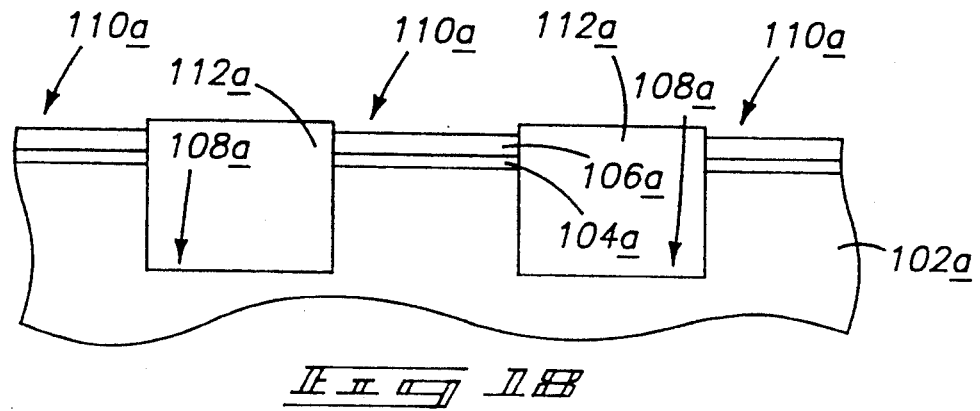
_FIG. 18_

TRENCH ISOLATION METHOD HAVING A DOUBLE POLYSILICON GATE FORMED ON MESAS

TECHNICAL FIELD

This invention relates to improved methods for isolating field effect transistors using trench isolation techniques.

BACKGROUND OF THE INVENTION

Although metal oxide semiconductor field effect transistors (MOSFETs) are fabricated within a common silicon substrate, they must nevertheless be electrically isolated from one another. They can subsequently be interconnected to create specific circuit configurations.

MOSFETs are said to be "self isolated," i.e., as long as their source-substrate and drain-substrate pn junctions are held at reverse bias, drain current is due only to current flow from source to drain through a channel under the gate. However, the metal strips used to interconnect MOS transistors form gates of parasitic MOS transistors, with the oxide beneath them forming a gate oxide. To isolate MOSFETs, therefore, it is necessary to prevent the formation of channels in the field regions. One way to accomplish this is to utilize a comparatively thick field oxide layer. However as device dimensions shrink, the nature of the field oxide formation process hampers creation of smaller, isolated devices.

Using "isolation trenches" rather than relying completely on field oxidation allows higher integration while still isolating adjacent devices. Electronic devices, typically FETs, are formed on "mesas" which are separated by oxide-filled "trenches". FIGS. 1-7 show the typical prior art steps in creating oxide trenches, and the resulting structure.

As shown in FIG. 1, a first oxide layer 10, commonly referred to as a pad oxide layer, is provided on top of a silicon substrate 12. A nitride layer 14 is subsequently applied over pad oxide layer 10. Pad oxide layer 10 cushions the transition of stresses between silicon substrate 12 and nitride layer 14. Nitride layer 14 functions as an etch stop during a subsequent planarization etching, as will be described. An oxide layer 16 is also applied over nitride layer 14. The purpose and function of pad oxide layer 10, nitride layer 14, and oxide layer 16 will be described more fully below.

Referring to FIG. 2, photoresist (not shown) is applied and patterned, and an etching step is performed using an appropriate sequence of etching chemicals as necessary to define isolation trenches 18 and mesa areas 20. When trenches 18 are relatively deep (one micron or greater), extended etching of silicon substrate 12 eventually removes the photoresist (not shown) over mesa areas 20. Since the chemical used to etch silicon substrate 12 is highly selective to oxide, oxide layer 16 functions as a secondary etch stop to prevent damage to nitride layer 14. Accordingly, oxide layer 16 is optional, and typically only used when etching deep trenches.

After etching the trench, oxide layer 16 is removed. A light oxidation is often also conducted at this point to remove etch damage from the trench bottoms and sidewalls.

Referring now to FIG. 3, a thick isolation oxide layer 22 is applied atop substrate 12. Isolation oxide layer 22 is sufficiently thick to fill isolation trenches 18 at least to the level of nitride layer 14. Isolation oxide layer 22 is subsequently etched (FIG. 4) using a planarization etching technique and using nitride layer 14 as an etch stop. Nitride layer 14 is subsequently removed (FIG. 5) leaving only pad oxide layer 10 atop mesa areas 20. Care must be used during the planarization etching to remove enough isolation layer oxide to expose underlying nitride layer 14, while insuring the height of the remaining oxide is at least as great as that of substrate 12. Otherwise, undesirable parasitic transistors are formed on the sidewalls of trenches.

Threshold voltage implanting and well implanting is then performed through pad oxide layer 10. Pad oxide layer 10 is typically damaged during the nitride etching and subsequent implanting, and cannot be subsequently used as a gate oxide. Therefore, it is removed. An etch performed to remove pad oxide layer 10 also removes a small portion of isolation oxide layer 22, as shown in FIG. 6. A gate oxide layer 26 (FIG. 7) and a polysilicon layer are applied, masked, and etched to form a FET gate 28. Finally, source and drain regions 24 are then formed, completing fabrication of the FET.

The foregoing method, while accomplishing the desired result, is somewhat inefficient. Particularly, the requirement of removing pad oxide layer 10 and then reapplying a gate oxide layer 26 results in unneeded repetition.

BRIEF DESCRIPTION OF THE DRAWINGS

One or more preferred embodiments of the invention are described below with reference to the accompanying drawings, which include:

FIG. 8 is a diagrammatic section view of a portion of a semiconductor wafer at one processing step of a processing method in accordance with the invention.

FIG. 9 is a diagrammatic section of a semiconductor wafer at a processing step subsequent to that illustrated by FIG. 8 using a processing method in accordance with the invention.

FIG. 10 is a diagrammatic section of a semiconductor wafer at a processing step subsequent to that illustrated by FIG. 9 using a processing method in accordance with the invention.

FIG. 11 is a diagrammatic section of a semiconductor wafer at a processing step subsequent to that illustrated by FIG. 10 using a processing method in accordance with the invention.

FIG. 16 is a diagrammatic section of a semiconductor wafer at a processing step subsequent to that illustrated by FIG. 15 using a processing method in accordance with the invention.

FIG. 17 is a diagrammatic section of a semiconductor wafer at a processing step subsequent to that illustrated by FIG. 16 using a processing method in accordance with the invention.

FIG. 18 is a diagrammatic section of a semiconductor wafer at a processing step subsequent to that illustrated by FIG. 17 using a processing method in accordance with the invention.

DETAILED DESCRIPTION OF THE PREFERRED EMBODIMENTS

Figure 1:
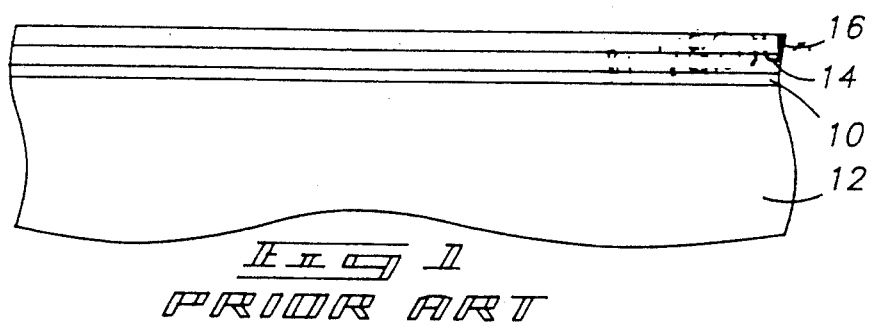
FIG. 1 is a diagrammatic section view of a portion of a semiconductor wafer at one processing step in accordance with prior art methods, and is described in the "Background" section above.
Figure 2:
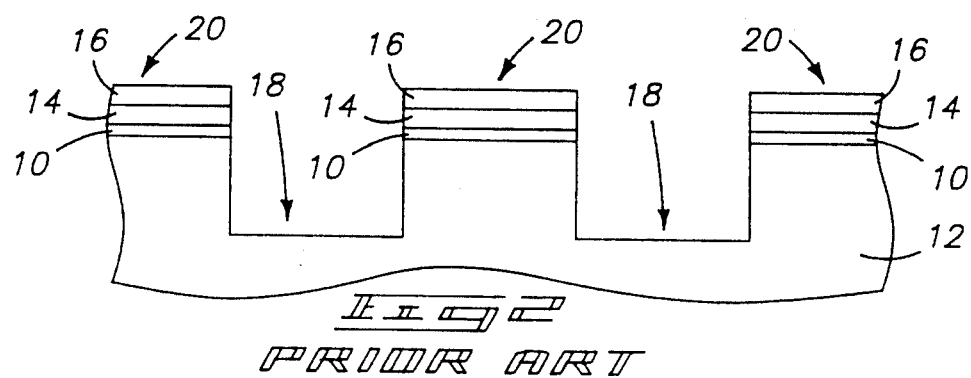
FIG. 2 is a diagrammatic section of a semiconductor wafer at a prior art processing step subsequent to that illustrated by FIG. 1, and is described in the "Background" section above.
Figure 3:
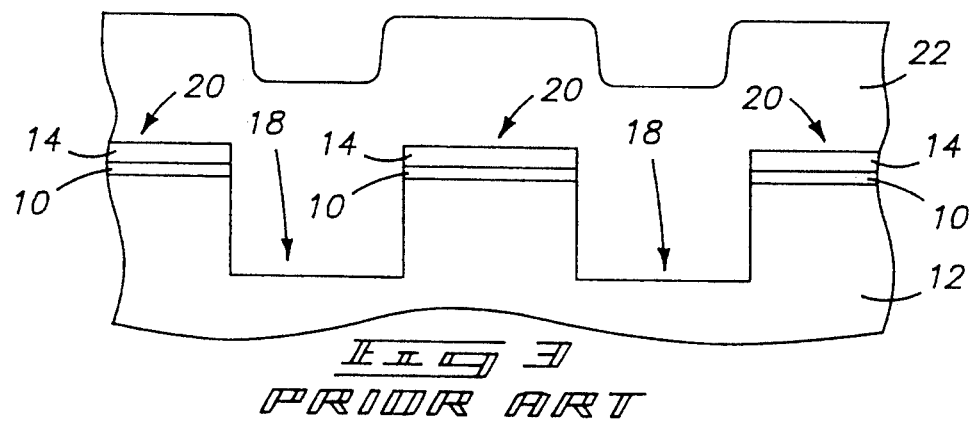
FIG. 3 is a diagrammatic section of a semiconductor wafer at a prior art processing step subsequent to that illustrated by FIG. 2, and is described in the "Background" section above.
Figure 4:
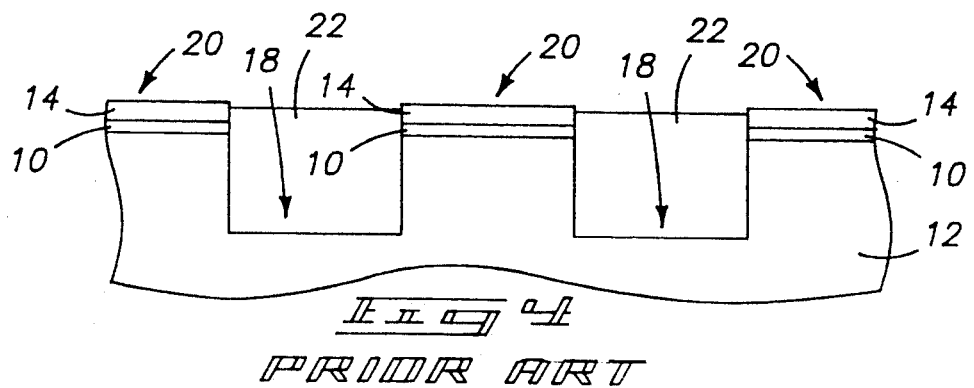
FIG. 4 is a diagrammatic section of a semiconductor wafer at a prior art processing step subsequent to that illustrated by FIG. 3, and is described in the "Background" section above.
Figure 5:
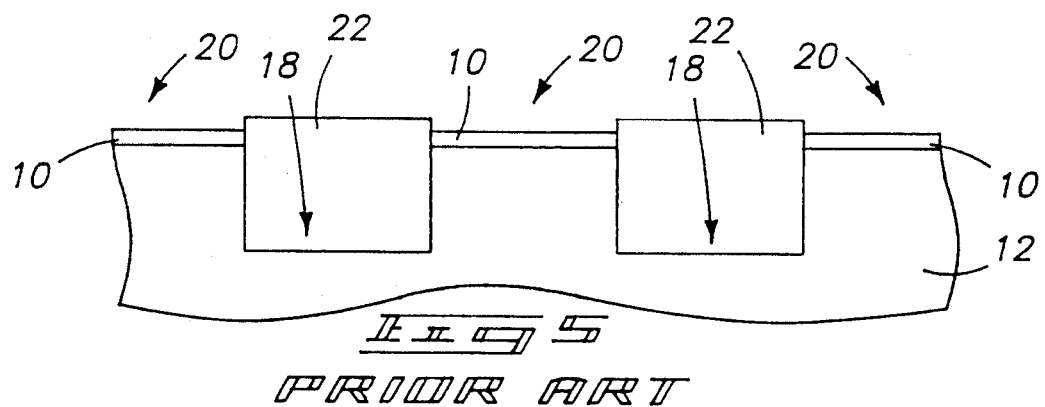
FIG. 5 is a diagrammatic section of a semiconductor wafer at a prior art processing step subsequent to that illustrated by FIG. 4, and is described in the "Background" section above.
Figure 6:
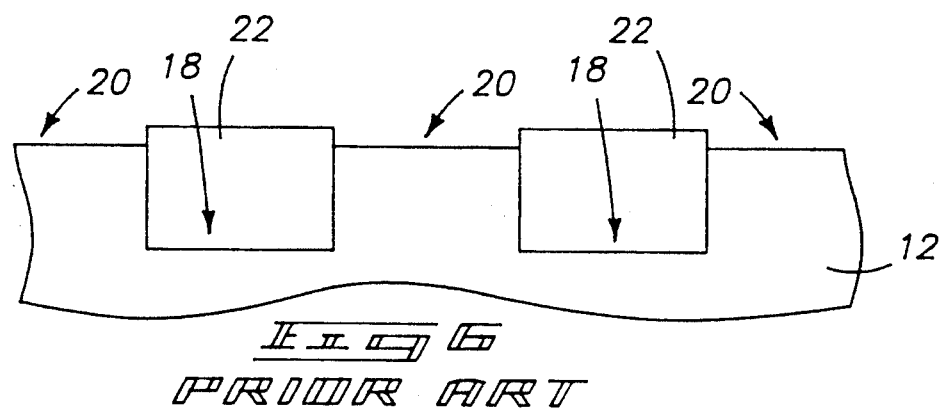
FIG. 6 is a diagrammatic section of a semiconductor wafer at a prior art processing step subsequent to that illustrated by FIG. 5, and is described in the "Background" section above.
Figure 7:
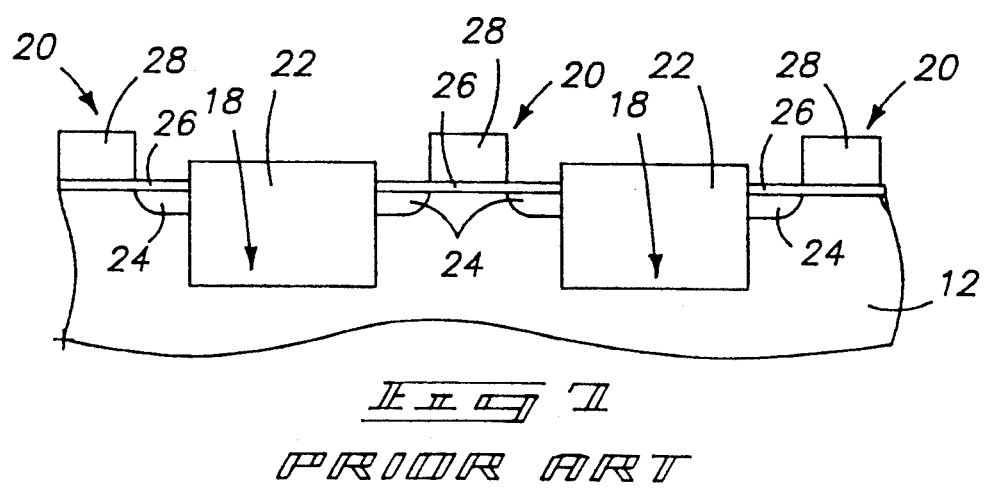
FIG. 7 is a diagrammatic section of a semiconductor wafer at a prior art processing step subsequent to that illustrated by FIG. 6, and is described in the "Background" section above.

This disclosure of the invention is submitted in furtherance of the constitutional purposes of the Patent Laws "to promote the progress of science and useful arts" (Article 1, Section 8).

In accordance with the invention, a method for isolating field effect transistors using trench isolation techniques comprises:
  providing a first oxide layer on a substrate;
  providing a polysilicon layer to a first thickness over the first oxide layer;
  etching the substrate to define isolation trenches and mesa areas, the mesa areas including polysilicon from the polysilicon layer;
  providing a second oxide layer atop the substrate to a thickness which is sufficient to fill the isolation trenches;
  etching the second oxide layer to remove second layer oxide above the mesa areas;
  exposing the polysilicon layer atop the mesa areas; and
  patterning and etching the first polysilicon layer to define FET gates in the mesa areas, with the first oxide layer beneath the polysilicon layer being utilized as gate oxide.

More specifically, FIGS. 8-13 illustrate one method of forming isolation trenches and mesa areas in semiconductor substrates, and of forming FETs in the mesa areas in accordance with the invention. A silicon substrate is generally designated by the reference numeral 102 in FIGS. 8-13. Referring initially to FIG. 8, a first or pad oxide layer 104, preferably SiO₂, is provided on substrate 102. Pad oxide layer 104 is for cushioning the stresses caused by subsequent processing steps, but will also eventually form gate oxide for FETs formed on substrate 102. Pad oxide layer 104 therefore has a thickness appropriate to its use as a gate oxide, preferably from about 75 Angstroms to 400 Angstroms. A gate oxide thickness from about 150 Angstroms to 200 Angstroms is most preferred in the current state of the art.

A thin first polysilicon layer 106 is subsequently provided over pad oxide layer 104. First polysilicon layer 106 protects pad oxide layer 104 during subsequent processing. For example, first polysilicon layer 106 protects pad oxide layer 104 from contaminants introduced from threshold voltage implants, photoresist application, and etching steps. Because of the protection provided by first polysilicon layer 106, pad oxide layer 104 can eventually form FET gate oxide. First polysilicon layer 106 itself eventually becomes part of a FET gate, although it need not be doped at this point. It will be autodoped during a later step, described below.

First polysilicon layer 106 is applied to a thickness which is sufficiently small to enable FET gate threshold implanting therethrough. Such threshold implanting is performed in subsequent steps to form gate channel regions for FETs formed on substrate 102. To allow such threshold implanting, the thickness of polysilicon layer 106 is preferably from about 200 Angstroms to 1000 Angstroms, with from about 300 Angstroms to 500 Angstroms being most preferred.

Referring now to FIG. 9, substrate 102 is etched to define isolation trenches 108 and mesa areas 110. Mesa areas 110 include polysilicon from first polysilicon layer 106, as well as oxide from first oxide layer 104. As an example, etching of isolation trenches 108 might include (1) applying and patterning photoresist; (2) anisotropically etching polysilicon layer 106; (3) anisotropically etching oxide layer 104; and (4) anisotropically etching substrate 102 to the desired depth, about 6000 Angstroms.

A light oxidation of isolation trenches 108 would typically be performed at this point to repair damage to bottoms and sidewalls of trenches 108 caused by the etching.

A second or isolation oxide layer 112, preferably SiO₂, is then provided atop substrate 102 to a thickness which is sufficient to fill isolation trenches 108 (FIG. 10). An etch is performed to remove portions of isolation oxide layer 112 above mesa areas 110 (FIG. 11), thereby exposing first polysilicon layer 106 atop mesa areas 110 as a result of the etch. Performing this etch also removes such oxide above isolation trenches 108, usually to a level below the top of first polysilicon layer 106. An example etch to achieve the illustrated profile might include applying photoresist to form an essentially planar surface and then etching in a manner which removes photoresist and oxide at essentially the same rate. Thus when the photoresist clears over the mesa areas 110, resist still remains over the isolation trenches 108. Continuing the etch removes oxide 112 from the above mesa areas 110 while removing photoresist over the isolation trenches 108 at the same rate. The etch is thus continued in this manner until all oxide 112 is removed over mesa areas 110, leaving isolation trenches 108 filled with oxide 112 as shown in FIG. 11.

Gate threshold implanting (not shown) is performed through first polysilicon layer 106 and pad oxide layer 104 to adjust FET threshold voltage in areas on mesa areas 110 where FET gates will be formed. As noted above, pad oxide layer 104 is sufficiently thin to allow such threshold implanting. As an example, gate threshold implanting through a 400 Angstroms thick first polysilicon layer 106 and a 180 Angstroms thick pad oxide layer 104 might include a $BF_2$ implant at a dose of 2 times $10^{12}$ atoms/$cm^2$ at an energy of 100 keV.

Figure 12:
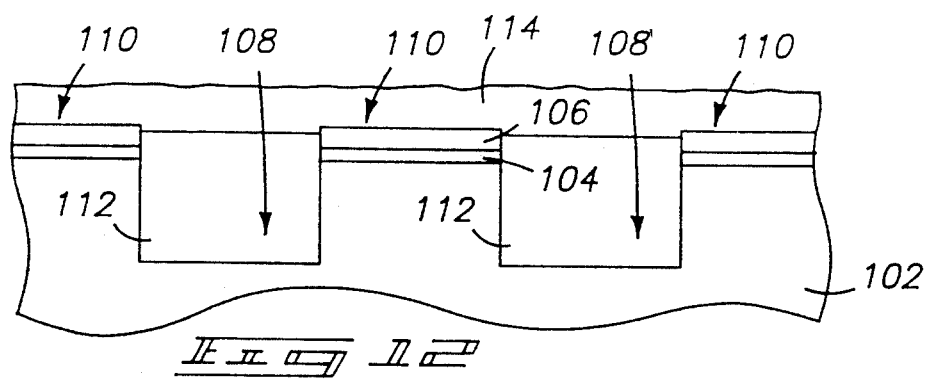
FIG. 12 is a diagrammatic section of a semiconductor wafer at a processing step subsequent to that illustrated by FIG. 11 using a processing method in accordance with the invention.

As shown in FIG. 12, a second polysilicon layer 114 is subsequently provided over the exposed first polysilicon layer 106 atop mesa areas 110, as well as over isolation oxide layer 112. Second polysilicon layer 114 is conductively doped, since it will form the FET gates.

Figure 13:
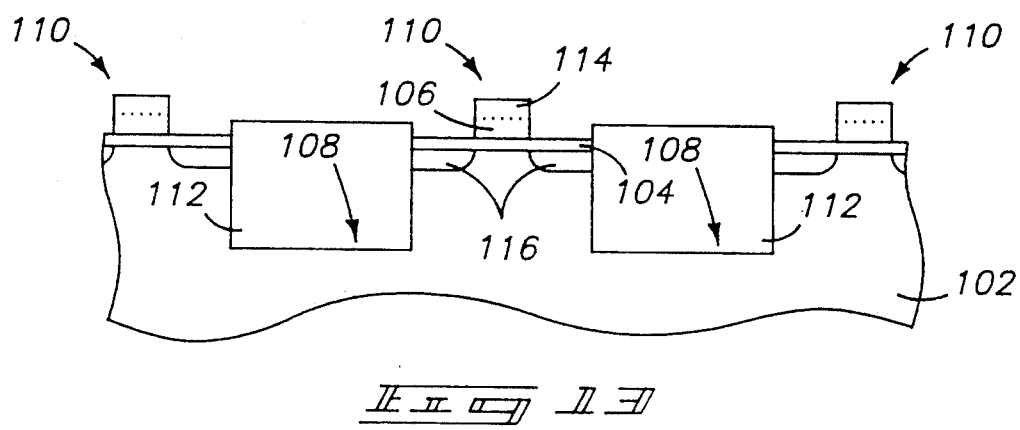
FIG. 13 is a diagrammatic section of a semiconductor wafer at a processing step subsequent to that illustrated by FIG. 12 using a processing method in accordance with the invention.

Referring to FIG. 13, both first and second polysilicon layers 106 and 114 are patterned and etched to define FET gates in mesa areas 110, with pad oxide layer 104 beneath first polysilicon layer 106 being utilized as a gate oxide. FET source and drain regions 116 are formed in substrate 102 through pad oxide layer 104. To dope first polysilicon layer 106, the temperature of first and second polysilicon layers 106 and 114 are raised sufficiently (i.e., to greater than 800° C.) to autodope first polysilicon layer 106 from second polysilicon layer 114.

FIGS. 14-20 illustrate an alternate method of forming isolation trenches, mesa areas, and FETs in the mesa areas. Since the method is similar to that shown in FIGS. 8-13, identical materials deposited during corresponding steps are denoted by identical reference numerals but for the addition of the suffix "a" to the reference numerals in FIGS. 14-20.

Figure 14:
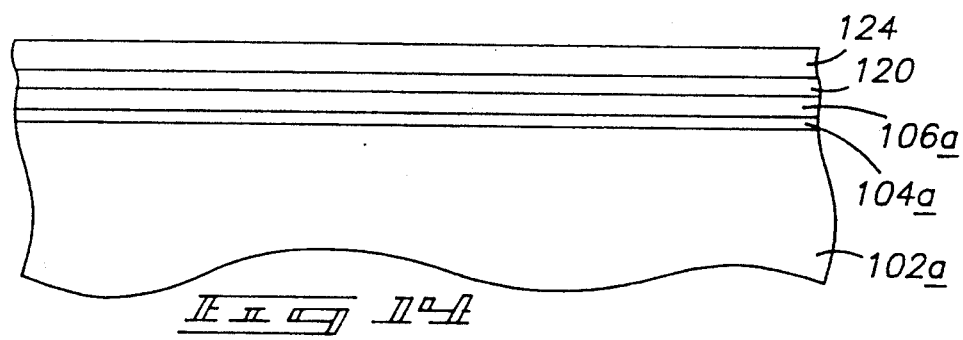
FIG. 14 is a diagrammatic section view of a portion of a semiconductor wafer at one processing step of an alternate processing method in accordance with the invention.

FIG. 14 shows silicon semiconductor substrate 102a to which has been applied a first or pad oxide layer 104a and a first polysilicon layer 106a as described above. Additionally, an etch stop layer 120 is applied over first polysilicon layer 106a to be used as an etch stop during subsequent etching of isolation oxide layer 112a (not shown in FIG. 14). Etch stop layer 120 is preferably comprised of a silicon nitride at a thickness of 100-1000 Angstroms applied over first polysilicon layer 106a. More specifically, the preferred thickness of etch stop layer 120 is about 500 Angstroms. A secondary etch stop layer 124, preferably $SiO_2$, is optionally applied over nitride layer 120. The function of secondary etch stop layer 124 is explained below.

Figure 15:
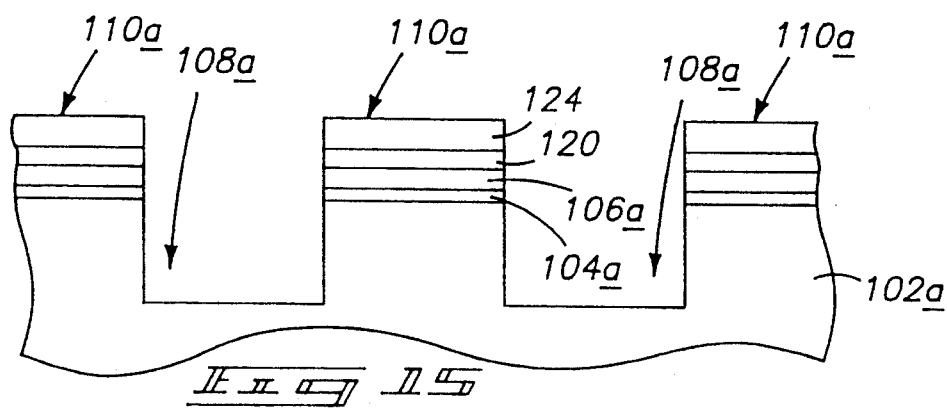
FIG. 15 is a diagrammatic section of a semiconductor wafer at a processing step subsequent to that illustrated by FIG. 14 using a processing method in accordance with the invention.

Referring to FIG. 15, photoresist (not shown) is applied and patterned, and an etching step is performed using an appropriate sequence of etching chemicals as necessary to define isolation trenches 108a and mesa areas 110a. Mesa areas 110a include polysilicon from first polysilicon layer 106a, as well as oxide from pad oxide layer 104a. This etching is similar to the corresponding etching already described with reference to the prior art in the "Background of the Invention."

When trenches 108a are relatively deep, for example greater than one micron, extended etching of silicon substrate 102a eventually removes the photoresist (not shown) over mesa areas 110a. Since the chemical used to etch silicon substrate 102a is highly selective to oxide, secondary etch stop layer 124 (an oxide) prevents damage to nitride layer 120. Secondary etch stop layer 124 is thus optional, and typically only used when etching deep trenches. If used, it is preferably removed after trench etching.

A light oxidation of isolation trenches 108a is often performed after etching trenches 108a to repair damage to sidewalls and bottoms of trenches 108a caused by the etching.

A second or isolation oxide layer 112a is then provided (FIG. 16) and etched (FIG. 17) using a planarization etching technique to remove all oxide from above mesa areas 110a. Nitride etch stop layer 120 is used as an etch stop during this etching. Nitride layer 120 is subsequently removed (FIG. 18), exposing first polysilicon layer 106a atop mesa areas 110a. As an example, such a planarization etching could comprise chemical mechanical polishing. Such polishing is selective to nitride etch stop layer 120 to form a planar topology essentially even with the top of nitride etch stop layer 120.

Note that, as compared to the prior art method discussed above, first polysilicon layer 106a gives added height to oxide remaining in trenches 108a after planarization, thus decreasing the likelihood of forming parasitic transistors on trench sidewalls by removing too much oxide.

Figure 19:
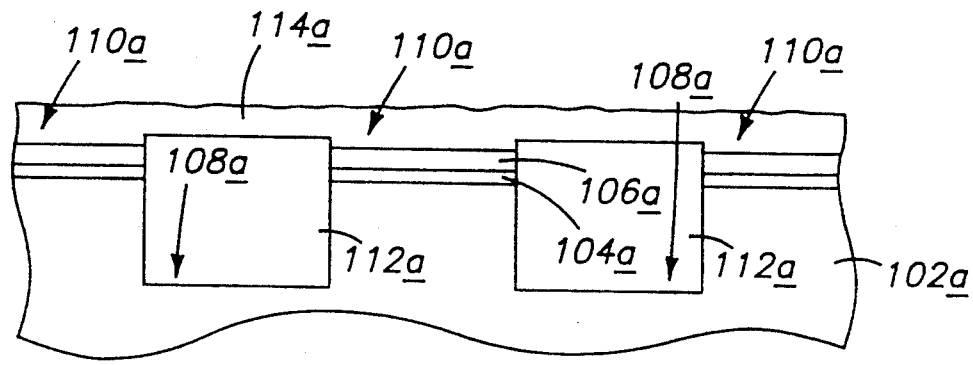
FIG. 19 is a diagrammatic section of a semiconductor wafer at a processing step subsequent to that illustrated by FIG. 18 using a processing method in accordance with the invention.
Figure 20:
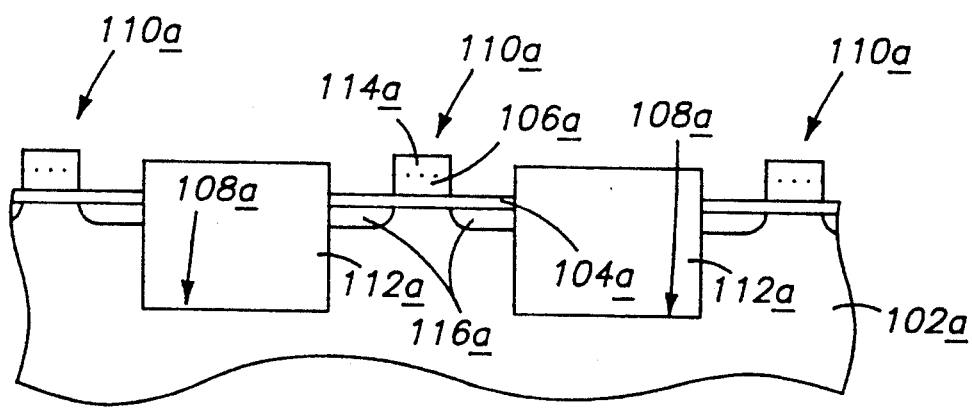
FIG. 20 is a diagrammatic section of a semiconductor wafer at a processing step subsequent to that illustrated by FIG. 19 using a processing method in accordance with the invention.

Threshold implanting is performed and drain and source wells are provided as already described with reference to FIG. 11. Subsequent steps, illustrated in FIGS. 19 and 20, are identical to the steps described with reference to FIGS. 12 and 13.

The methods described provide advantages over prior art methods in both process efficiency and semiconductor quality. Among the advantages is the elimination of processing steps otherwise required to remove the pad oxide layer and to subsequently apply a gate oxide layer. Also, the thin first layer of polysilicon adds height to the trench oxide, reducing the possibility of parasitic transistors being formed on trench sidewalls. Further, the thin first layer of polysilicon protects the underlying gate oxide from contaminants during various processing steps such as gate threshold implanting, photoresist application, and etching.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming isolation trenches and mesa areas in a substrate and forming FETs in the mesa areas, the method comprising:
    providing a first oxide layer on a substrate;
    providing a first polysilicon layer to a first thickness over the first oxide layer;
    etching the first oxide layer, the first polysilicon layer and substrate to define isolation trenches and mesa areas, the mesa areas including polysilicon from the first polysilicon layer;
    providing a second oxide layer atop the substrate to a thickness which is sufficient to fill the isolation trenches;
    etching the second oxide layer to remove second layer oxide above the mesa areas;

exposing the first polysilicon layer atop the mesa areas;

providing a second polysilicon layer over the exposed first polysilicon layer, the second polysilicon layer being conductively doped; and patterning and etching the first and second polysilicon layers in the same step to define FET gates in the mesa areas, with the first oxide layer beneath the first polysilicon layer being utilized as gate oxide.

2. The method of claim 1 further comprising applying an etch stop layer over the first polysilicon layer and using the etch stop layer as an etch stop during etching of the second oxide layer.

3. The method of claim 1 further comprising applying a nitride layer over the first polysilicon layer and using the nitride layer as an etch stop during etching of the second oxide layer.

4. The method of claim 1 further comprising:
applying a nitride layer over the first polysilicon layer;
applying a secondary etch stop layer of oxide over the nitride layer; and
using the nitride layer as an etch stop during etching of the second oxide layer.

5. The method of claim 1 wherein the first thickness of the first polysilicon layer is from about 200 Angstroms to 1000 Angstroms.

6. The method of claim 1 wherein the first thickness of the first polysilicon layer is from about 300 Angstroms to 500 Angstroms.

7. The method of claim 1 further comprising performing a gate threshold implant through the first polysilicon layer and the first oxide layer to adjust FET threshold voltage, the first thickness of the first polysilicon layer being sufficiently small to enable such threshold implant.

8. The method of claim 1 further comprising raising the temperature of the first and second polysilicon layers sufficiently to autodope the first polysilicon layer from the second polysilicon layer.

9. The method of claim 1 wherein the first oxide layer has a thickness from about of 75 Angstroms to 400 Angstroms.

10. The method of claim 1 wherein the first oxide layer has a thicknes from about 150 Angstroms to 200 Angstroms.

11. The method of claim 1 further comprising forming FET source and drain regions in the substrate through the first oxide layer.

12. A method of forming isolation trenches and mesa areas in a substrate and forming FETs in the mesa areas, the method comprising:
providing a pad oxide layer on a substrate;
providing a first polysilicon layer to a first thickness over the pad oxide layer;
applying a nitride layer over the first polysilicon layer;
etching the pad oxide layer, the first polysilicon layer, nitride layer and substrate to define isolation trenches and mesa areas, the mesa areas including polysilicon from the first polysilicon layer;
providing an isolation oxide layer atop the substrate to a thickness which is sufficient to fill the isolation trenches;
etching the isolation oxide layer to remove isolation oxide above the mesa areas and using the nitride layer as an etch stop for the isolation oxide layer etch;
removing the nitride layer and exposing the first polysilicon layer atop the mesa areas;
performing a gate threshold implant through the first polysilicon layer and the pad oxide layer to adjust FET threshold voltage, the first thickness of the first polysilicon layer being sufficiently small to enable such threshold implant;
providing a second polysilicon layer over the exposed first polysilicon layer, the second polysilicon layer being conductively doped; and
patterning and etching the first and second polysilicon layers the same step to define FET gates in the mesa areas, with the pad oxide layer beneath the first polysilicon layer being utilized as gate oxide.

13. The method of claim 12 wherein the first thickness of the first polysilicon layer is from about 200 Angstroms to 1000 Angstroms.

14. The method of claim 12 wherein the first thickness of the first polysilicon layer is from about 300 Angstroms to 500 Angstroms.

15. The method of claim 12 wherein the pad oxide layer has a thickness from about 75 Angstroms to 400 Angstroms.

16. The method of claim 12 wherein the pad oxide layer has a thickness from about 150 Angstroms to 200 Angstroms.

17. The method of claim 12 further comprising applying a secondary etch stop layer of oxide over the nitride layer.

18. The method of claim 12 further comprising raising the temperature of the first and second polysilicon layers sufficiently to autodope the first polysilicon layer from the second polysilicon layer.

19. The method of claim 12 further comprising forming FET source and drain regions in the substrate through the pad oxide layer.

20. A method of forming isolation trenches and mesa areas in a substrate and forming FETs in the mesa areas, the method comprising:
providing a pad oxide layer on a substrate, the pad oxide layer having a thickness from about 75 Angstroms to 400 Angstroms;
providing a first polysilicon layer over the pad oxide layer, the first polysilicon layer having a thickness from about 200 Angstroms to 1000 Angstroms;
applying a nitride layer over the first polysilicon layer;
applying a secondary etch stop layer of oxide over the nitride layer;
etching the pad oxide layer, first polysilicon layer, nitride layer, secondary etch stop layer substrate to define isolation trenches and mesa areas, the mesa areas including polysilicon from the first polysilicon layer;
providing an isolation oxide layer atop the substrate to a thickness which is sufficient to fill the isolation trenches;
etching the isolation oxide layer and the secondary etch stop layer to remove oxide above the mesa areas using the nitride layer as an etch stop;
removing the nitride layer and exposing the first polysilicon layer atop the mesa areas;
performing a gate threshold implant through the first polysilicon layer and the pad oxide layer to adjust FET threshold voltage;

providing a second polysilicon layer over the exposed first polysilicon layer, the second polysilicon layer being conductively doped;
raising the temperature of the first and second polysilicon layers sufficiently to autodope the first polysilicon layer from the second polysilicon layer;
patterning and etching the first and second polysilicon layers in the same step to define FET gates in the mesa areas, with the pad oxide layer beneath the first polysilicon layer being utilized as gate oxide; and
forming FET source and drain regions in the substrate through the pad oxide layer.

* * * * *